United States Patent [19]

Kopel et al.

[11] Patent Number: 5,044,053

[45] Date of Patent: Sep. 3, 1991

[54] METHOD OF MANUFACTURING A CURVED ARRAY ULTRASONIC TRANSDUCER ASSEMBLY

[75] Inventors: Leroy A. Kopel, Tempe; Randy G. Plank, Mesa, both of Ariz.

[73] Assignee: Acoustic Imaging Technologies Corporation, Phoenix, Ariz.

[21] Appl. No.: 526,569

[22] Filed: May 21, 1990

[51] Int. Cl.⁵ .............................................. H01L 41/22
[52] U.S. Cl. .................................. 29/25.35; 310/327; 310/335
[58] Field of Search .......................... 29/25.35; 73/362; 310/327, 335, 334, 365, 366

[56] References Cited

U.S. PATENT DOCUMENTS 4,734,963 4/1988 Ishiyama ............................ 29/25.35
4,894,895 1/1990 Rokurohta et al. ................. 29/25.35

Primary Examiner—Carl E. Hall
Attorney, Agent, or Firm—Christie, Parker & Hale

[57] ABSTRACT

A curved array ultrasonic transducer is manufactured by cutting a flat transducer plate, which is attached to a flexible support plate, into a plurality of segments, the segments being hingedly attached by the support plate. The support plate is bent to a radius and the conductive traces in a flexible circuit board are electrically connected to the transducer plate segments. The flexible circuit board, having a plurality of branches, is bent to a perpendicular position such that the traces in the plurality of branches become substantially aligned. The traces exiting the branches are then electrically connected to a pin and socket connector device.

11 Claims, 5 Drawing Sheets

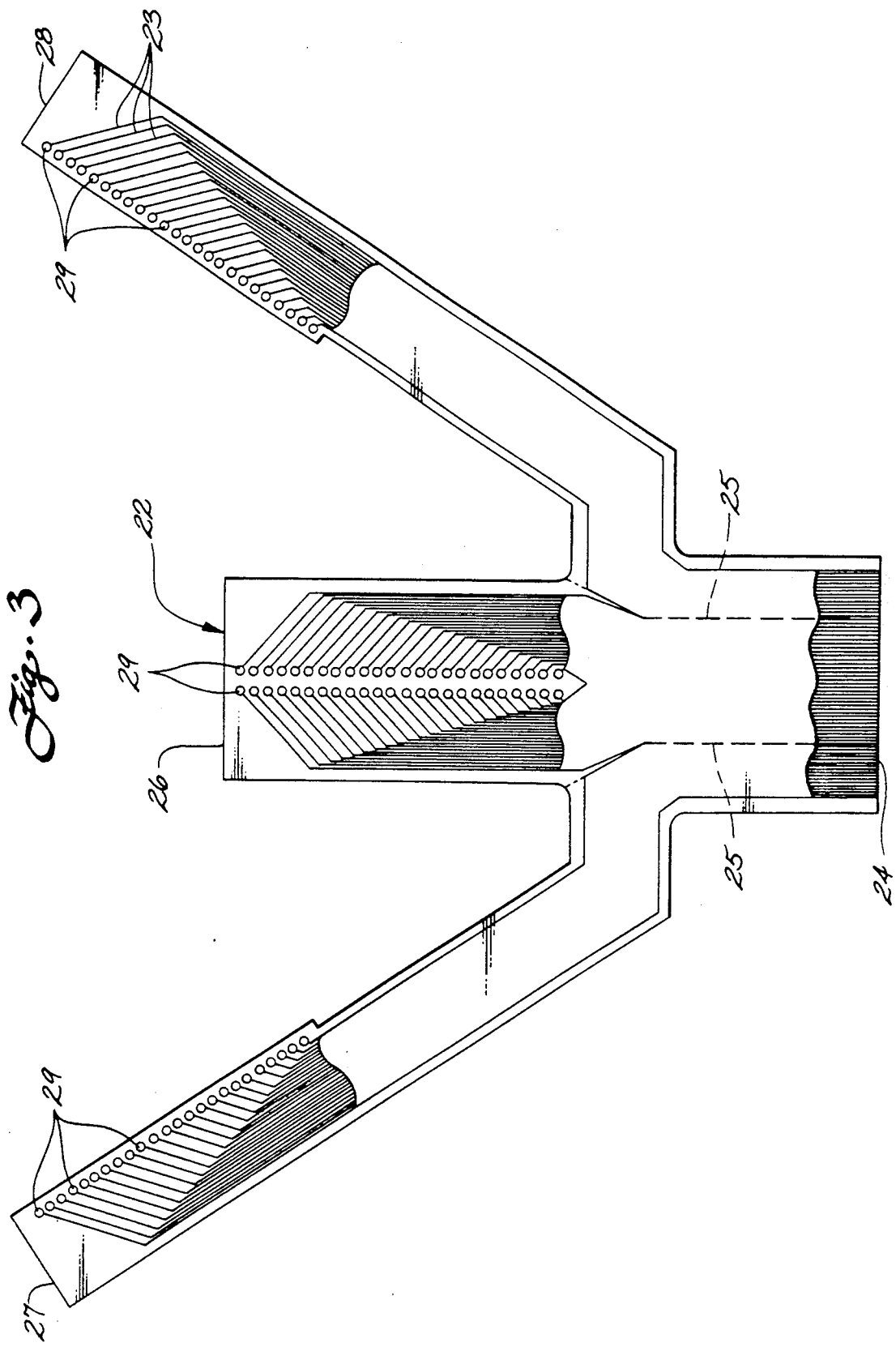

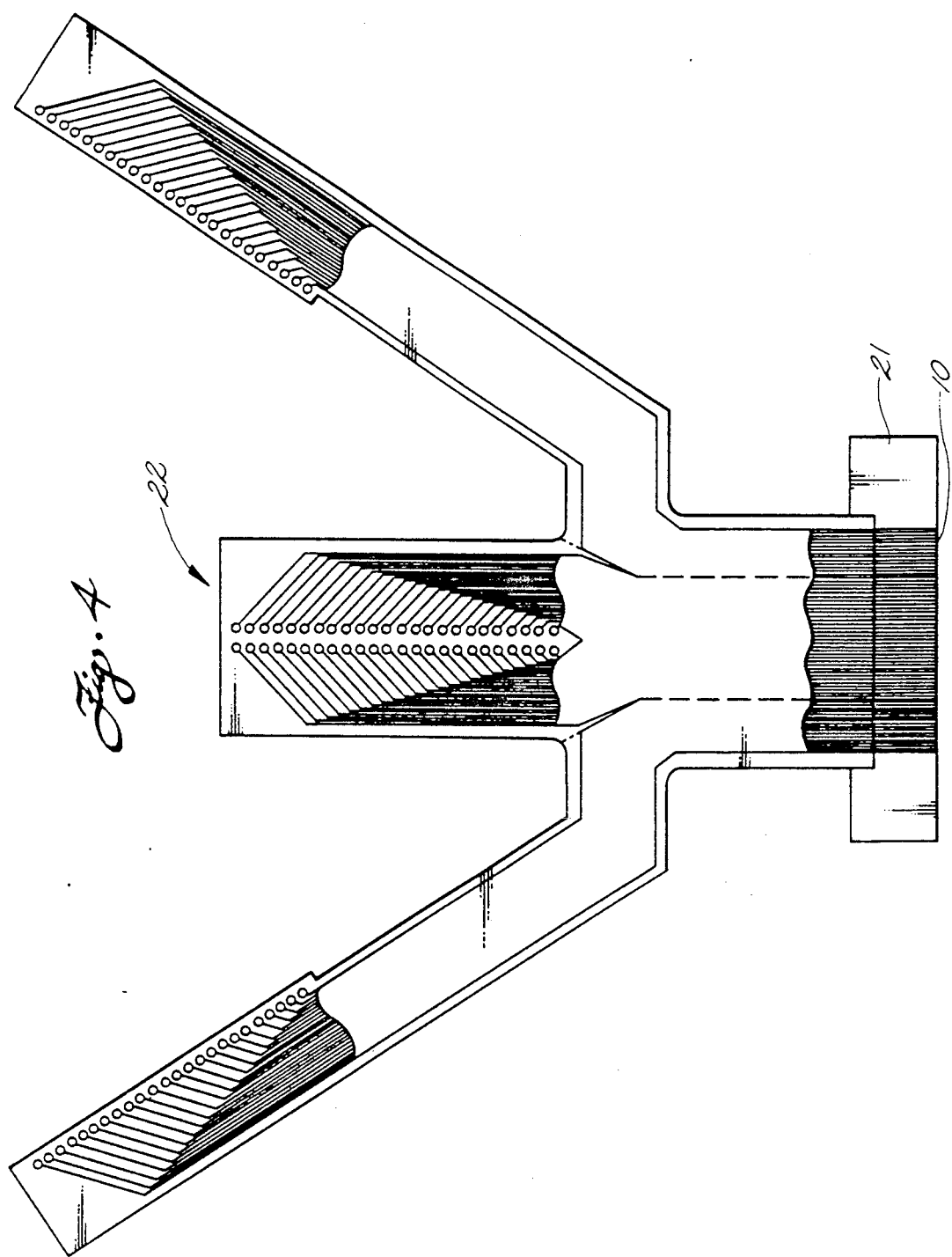

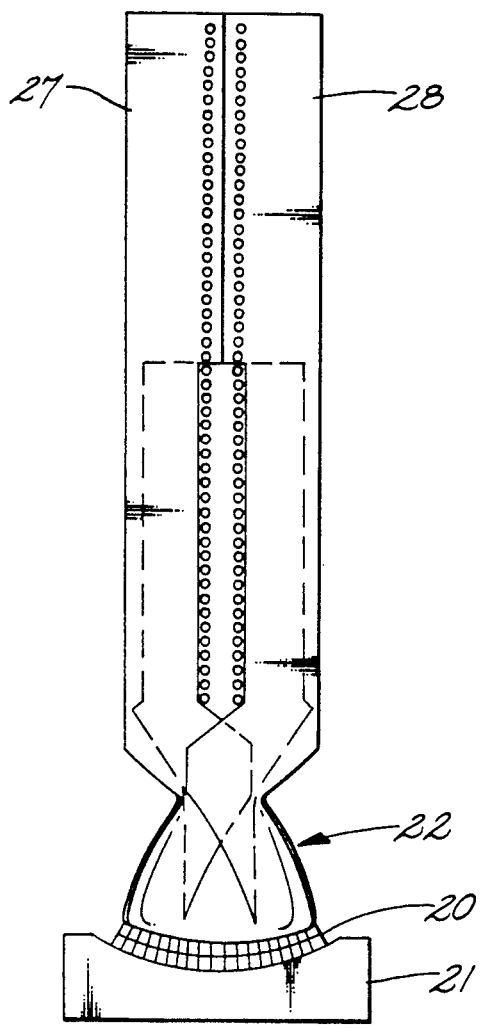
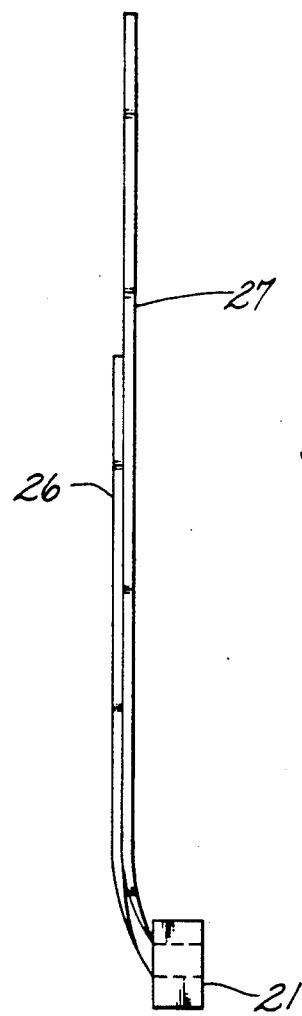
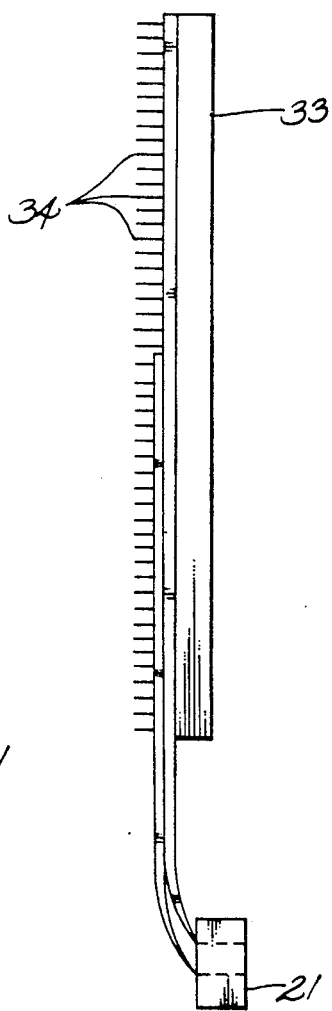
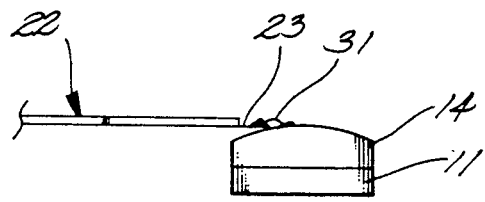

5,044,053

METHOD OF MANUFACTURING A CURVED ARRAY ULTRASONIC TRANSDUCER ASSEMBLY

FIELD OF THE INVENTION

This invention generally relates to the field of ultrasonic medical transducer assemblies, and, more particularly, to a curved array ultrasonic transducer assembly having a flexible interconnect system, and a method of its manufacture.

BACKGROUND OF THE INVENTION

Ultrasonic medical transducers are used to observe the internal organs of a patient. Such an apparatus produces the display of successive images at a rapid rate so that an observer can see movements of an organ in "real time". Curved transducer arrays are used, rather than flat arrays, to enhance the performance of the ultrasonic imaging device. Principally, a curved array will produce an image over a wider field of view and thus permit the observer to view objects that would ordinarily be hidden from view when using a flat array (for example, a bone, such as a rib may obstruct the view of an internal organ).

Typically, curved transducer arrays are fabricated by soldering a flexible circuit board to a flat transducer plate, the transducer plate generally comprising a ceramic substrate sandwiched between conductive electronic plates. A backing material is then bonded to what will become the concave surface of the array. The transducer plate is then cut into segments and subsequently formed into a curvilinear array. The backing material acts as a hinge to allow the segmented ceramic to bend while maintaining positioning between segments.

For example, U.S. Pat. No. 4,734,963 to Ishiyama discloses a method of manufacturing a curvilinear array of ultrasonic transducers wherein a flexible printed circuit board is connected to one edge of a rigid transducer plate. The transducer plate, being previously bonded to a flexible support plate, is then diced through to the support plate thus dividing the transducer plate into a series of parallel transducer elements. The support plate is then conformed to a curved shape.

SUMMARY OF THE INVENTION

A presently preferred embodiment of the present invention provides a method of manufacturing a curved array medical transducer, whereby transducer array elements are formed by first bonding a flexible support layer to one surface of a transducer plate. The transducer plate is cut into segments, each cut penetrating only a portion of the support layer, thus forming a plurality of transducer array elements each being bonded to the support layer. The support layer is then bent to the desired radius to form a curved array of transducer elements.

A flexible circuit board, having conductive traces disposed therein for transmitting electrical signals to and from the transducer elements, is aligned with the curved array such that the traces are adjacent to the transducer elements. The traces are then electrically connected to the transducer elements in the array.

The conductive traces extend into a plurality of branches in the flexible circuit board. After connection of the transducer elements to the circuit board, the circuit board is bent toward the center of the array at a right angle. In doing so, conductive holes, which are associated with the ends of the conductive traces in the branches, become aligned in such a manner that a connector can be soldered to the holes in the conductive traces.

BRIEF DESCRIPTION OF THE DRAWINGS

These and other features and advantages of the present invention will be better understood by reference to the following detailed description when considered in conjunction with the accompanying drawings wherein:

FIG. 3 is a plan view of an exemplary flexible circuit board;

FIG. 4 is plan view of the flexible circuit board shown in relationship to the transducer array on the tooling form;

FIG. 5 is a sectional view of a conductive trace in the circuit board in relationship to a transducer array element;

FIG. 6 and FIG. 7 are front and side elevational views, respectively, of the circuit board in its operative position.

FIG. 8 is a side elevational view of the circuit board shown in FIG. 7 in operative relationship to the connector.

DETAILED DESCRIPTION

Figure 1A:
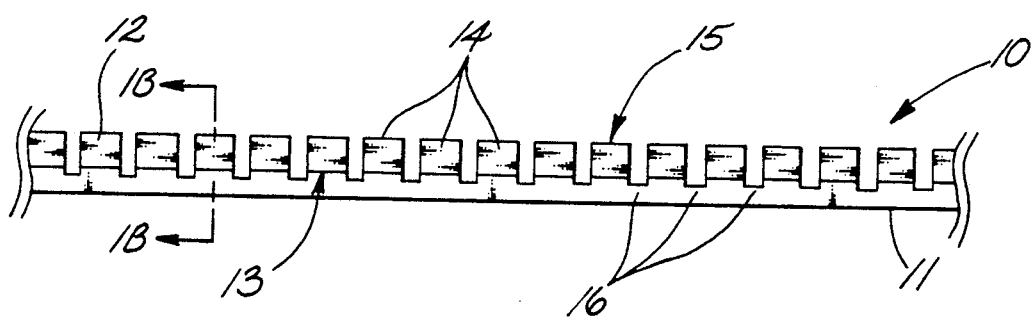
FIG. 1a is an elevational view of an exemplary transducer plate support plate assembly.

An exemplary curved transducer array 10 is formed according to the following steps. First, an elongate strip of piezo material 8 having a substantially rectangular cross-section is completely encased in metalization such that the piezo material 8 is surrounded on all sides by conductive material 17 thus forming a transducer plate 12 comprised of piezo-electric material. Next, two longitudinal cuts are made along the top side 15 of the transducer plate, thus forming two grooves 9 in the transducer plate running along its length. Each groove 9 is deep enough to cut entirely through conductive material 17. Accordingly, two isolated conductive areas, or electrodes, are formed.

The "hot" electrode 18 is formed along the top surface 15 of the transducer plate 12. The ground electrode 19 is formed along the other surfaces (bottom and sides) of the piezo material. The grooves 9 are cut such that the ground electrode 19 slightly wraps around to the top surface 15 of the transducer plate. This provides access to both the hot electrode 18 and the ground electrode 19 along the top surface of the plate 12.

Figure 1B:
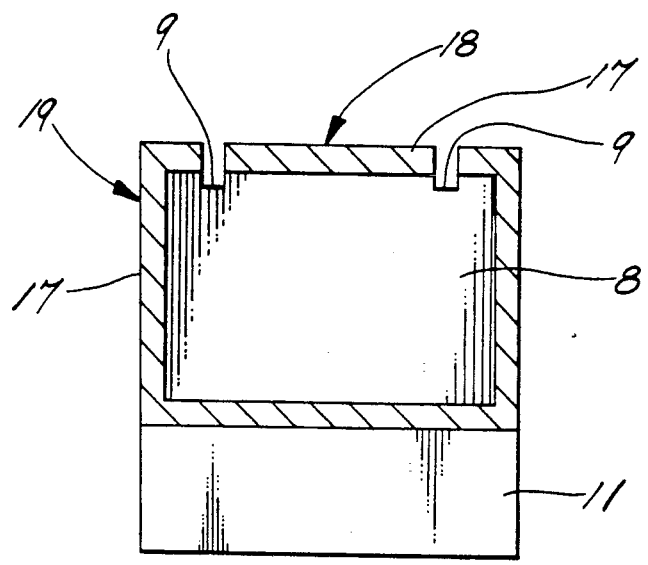
FIG. 1b is a sectional view of an exemplary transducer array element.

A flexible support plate 11 is bonded to the transducer plate 12 along one surface 13 of the transducer plate. In the embodiment described above, the support layer is bonded to the surface opposite the top surface 15 of the transducer plate to allow access to the "hot" electrode. The transducer plate is then cut into segments 14 from top surface 15 of the transducer plate to form an array of individual transducer elements. Each cut extends into the support plate 11 but leaves a portion of the support layer uncut thus creating hinge points 16 in the assembly, as illustrated in FIG. 1. The transducer plate 12 is cut into segments by means of a conventional semiconductor dicing saw.

The hinge points 16 allow the transducer array 10 to be bent into an arc. The particular radius of the arc depends on the application in which the transducer will be used.

When the strip of piezo-electric material is cut into segments to form the individual transducer elements, the ground electrode 19 and hot electrode 18 of each element is completely isolated from the electrodes of the other transducer elements. Once the transducer array is formed to the desired radius, the ground electrode of each array element is connected by soldering each of two ground bus wires (not shown) along the top edges of the array. The wires run along the top surface of the piezo-electric material in the areas where the ground electrode 19 of each array element wrap around to said top surface. The ground bus wires are connected to each of the transducer elements thus forming a ground plane common to all of the elements.

Figure 2:
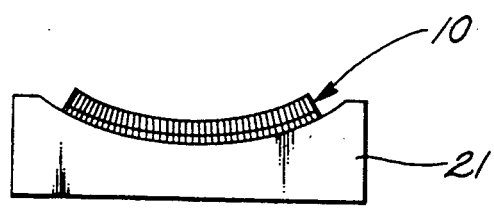
FIG. 2 is an elevational view of a transducer array sitting in a curved tooling form.

Referring to FIG. 2, a transducer array 10 formed in the manner described above, is secured in a tooling form 21 of desired radius. In an exemplary embodiment, the transducer array is secured in place using adhesive tape. Segments 14 comprise the elements of the transducer array 10. The tooling form provides support for the transducer array while it is being worked on.

In an exemplary embodiment, the top surface 15 of the transducer array will become the concave surface of the array and the support plate will become the convex surface. In use, the concave surface of the transducer array has electrical connections made to it and the convex surface is aligned to the subject to be scanned (i.e. a body part). The support layer has a thickness and impedance chosen to maximize energy transfer into the body.

A flexible circuit board is used to connect the transducer array to a connector device 33. In an exemplary embodiment, a flexible circuit board 22 of the shape shown in FIG. 3 is used. The circuit board has a plurality of conductive traces 23 disposed within it, each trace having two ends. One end of each trace appears in the root 24 of the circuit board for eventual connection to the transducer array. The opposite end of each trace fans out to one of three branches of the flexible circuit board. The middle branch 26 is directly opposite the root of the circuit board. Two angled branches 27 and 28 exit at either edge of the root. The branches are extendable along the dashed lines 25 shown in FIG. 3. In other words, the circuit board is cut along lines 25 to extend the branches nearly down to the root 24. Each of the traces in each branch of the circuit board end at a connector hole 29. Each connector hole is surrounded by an exposed portion of its relative trace to form an eyelet. Separate electrical connections are thus established between each trace and a corresponding eyelet.

In an exemplary embodiment, there are ninety-six conductive traces in the flexible circuit board. All ninety-six traces appear and are exposed for purposes of electrical connection at the root of the circuit board. One half of the traces flow into the middle branch of the circuit board, and one quarter of the traces flow into each of the angled branches. The connector holes in each branch of the circuit board are aligned in columns. The middle branch has two parallel columns of connector holes running down the center of that branch. The angled branches each have one column of connector holes aligned along the upper edge of each branch.

Referring to FIG. 4, the flexible circuit board 22 is positioned with respect to the array 10 such that the exposed traces at the root of the circuit board are aligned with the individual elements in the array 10. The curve of the root of the circuit board matches that of the array. That is, the root is bowed to allow the conductive traces to align adjacent to the elements.

The traces in the flex board are then electrically connected to the elements in the array. More specifically, the traces in the flex board are electrically connected to the hot electrode 18 resident on each element in the transducer array. In an exemplary embodiment, the electrical connection between each trace in the flexible board and the corresponding transducer array element is made by wire bonding. A conventional wire bonding machine is used to make the electrical connections. FIG. 5 shows an enlarged view of a single element 16 and the flexible circuit board 22. The trace 23 aligned with this element is electrically connected to the element with a wire bond 31. In alternative embodiments, this connection is made by reflow solder methods or micro-welding.

In an exemplary embodiment, once all of the traces have been electrically bonded to the elements in the array, an insulator material is poured into the spaces between the array elements. The insulator material also covers the wire bonds on each array element and thus enhances the structural integrity of the electrical connections.

The three branches of the flexible circuit board are then bent upward (toward the center of the arc formed by the crystal assembly) to a position approximately perpendicular to the chord of the arc formed by the array. The two angled branches 27 and 28 are brought together such that the eyelets in each angled branch align, and each angled branch lies in the same plane as the middle branch 26. The shape of the circuit board allows the branches to overlap and to create a substantially smooth 90 degree bend in the circuit board when positioned in this perpendicular orientation. As shown in FIGS. 6, 7 and 8, the geometry of the angled branches 27 and 28 of the flexible circuit board 22 allows the connector holes 29 in each branch to align with each other, thus creating two parallel columns of connector holes. Furthermore, the connector hole columns in the angled branches align with the two parallel columns of connector holes in the first branch 26 of the circuit board. This creates two continuous columns of connector holes when the branches of the circuit board are bent to their perpendicular orientation. The upper portion of each column is formed by the connector holes in the angled branches and the lower portion of each column is formed by the connector holes in the middle branch.

A standard pin and socket connector 33 having two parallel columns of pins 34 on one side and corresponding sockets on the opposite side is used to interface the aligned branches of the circuit board. The pins 34 are inserted through the connector holes 29 in the circuit board. The pins are then soldered to the conductive eyelets that surround each of the connector holes to establish an electrical connection between each trace and its corresponding pin.

In an exemplary embodiment, the transducer array 10, along with the flexible circuit board and the connector is disposed within a transducer assembly housing. Ground connections between the transducer array and the housing are made via radial bus wires (not shown) connected between the ground bus wires on the transducer array and the interior of the housing. Accordingly, each ground bus wire has a plurality of radial bus wires connected to it to provide for the above-described connection. Typically, for a transducer array having 96 transducer elements, there are approximately fifteen radial bus wires connected to each of the two ground bus wires on the array.

The radial bus wires are connected to the transducer array 10 prior to the connection of the flexible circuit board to the transducer array. After the radial bus wires are connected to the array, they are bent down to a position substantially parallel to the axis of the arc formed by the curved transducer array to accommodate the connection of the flexible circuit board. Once the flexible circuit board has been connected and bent into its operative position, the radial bus wires are bent up to a position substantially parallel to the flexible circuit board to facilitate their connection to the housing.

The sockets of the connector 33 are electrically connected to a cable which exits the transducer assembly housing and which connects the transducer assembly with the rest of the imaging apparatus. The cable comprises a bundle of individual wires, each of which carry signals to and from the elements of the array.

In an exemplary embodiment, the cable is anchored to the inside of the housing at a point along the cable between the connector 33 and the point at which the cable exits the housing. This anchor isolates the flexible circuit board and its connection to the array from tension exerted on the cable.

The preceding description has been presented with reference to the presently preferred embodiment to the invention shown in the drawings. Workers skilled in the art and technology to which this invention pertains will appreciate that alterations and changes in the described structures can be practiced without departing from the spirit, principles and scope of this invention.

Accordingly, the foregoing description should not be read as pertaining only to the precise structure described, but rather should be read consistent with, and as support for, the following claims.

What is claimed is:

1. A method of connecting a flexible circuit board to a flexible array of ultrasonic transducer elements comprising the following steps in the sequence set forth:
   bending the flexible array to a desired radius;
   securing the array in a curved tooling form of the desired radius;
   aligning conductive traces in the flexible circuit board with the elements of the array in the tooling form; and
   electrically connecting the aligned traces to the elements of the curved array while in the tooling form.

2. A method of manufacturing a curved array ultrasonic transducer assembly comprising the following steps in the order set forth:
   bonding a flexible support layer to one longitudinal edge of an ultrasonic transducer plate;
   cutting the transducer plate into a plurality of segments while leaving a portion of the flexible support layer uncut between each segment;
   bending the support layer, having the individual segments bonded thereto, to a desired radius thus forming a convexly curved transducer array;
   electrically connecting traces at a first end of a flexible circuit board to the respective transducer segments;
   bending the flexible circuit board toward the center of the arc formed by the curved transducer array such that it is substantially perpendicular to the chord of the formed arc; and
   electrically connecting a connector to the traces at a second end of the flexible circuit board.

3. A method as recited in claim 2 further comprising the step of adding insulating material between the segments and over the electrical connections to the flexible circuit board following the step whereby the traces are electrically connected to the transducer segments.

4. A method as recited in claim 2 wherein the step of electrical connecting the traces to the transducer segments comprises wire bonding the traces in the flexible circuit board to the elements.

5. A method as recited in claim 2 wherein the flexible circuit board has conductive traces disposed within it which begin at the first end of the circuit board and end at the second end of the circuit board.

6. A method as recited in claim 5 wherein the second end of the flexible circuit board comprises a plurality of branches.

7. A method as recited in claim 6 wherein the ends of the conductive traces in each branch substantially align with each other when the flexible circuit board is bent in the perpendicular orientation.

8. A method as recited in claim 2 wherein the transducer plate is formed by a method comprising the following steps:
   encasing an elongate strip of piezo-electric material in a conductive material; and
   cutting two longitudinal grooves along the elongate strip thus separating the conductive layer into two separate areas, each being electrically isolated.

9. A method as recited in claim 8 wherein the grooves are cut along a common longitudinal edge.

10. The method of claim 2, additionally comprising the step of securing the transducer array in a tool form of the desired radius before the connecting and bending steps.

11. The method of claim 2, in which the second end of the flexible circuit board comprises a plurality of branches in which the traces are formed, the traces in each branch terminating in a column of connector eyelets, the method additionally comprising the steps of:
    bending the branches to align the eyelets of the branches in the same plane; and
    inserting pins of a pin and socket connector into the eyelets.

* * * * *